United States Patent
Ingle et al.

(10) Patent No.: US 7,939,422 B2
(45) Date of Patent: May 10, 2011

(54) METHODS OF THIN FILM PROCESS

(75) Inventors: Nitin K. Ingle, Santa Clara, CA (US); Jing Tang, Santa Clara, CA (US); Yi Zheng, San Jose, CA (US); Zheng Yuan, Fremont, CA (US); Zhenbin Ge, San Jose, CA (US); Xinliang Lu, Fremont, CA (US); Chien-Teh Kao, Sunnyvale, CA (US); Vikash Banthia, Mountain View, CA (US); William H. McClintock, Los Altos, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 15 days.

(21) Appl. No.: 11/947,674

(22) Filed: Nov. 29, 2007

(65) Prior Publication Data
US 2008/0182382 A1 Jul. 31, 2008

Related U.S. Application Data

(60) Provisional application No. 60/869,066, filed on Dec. 7, 2006.

(51) Int. Cl.
*H01L 21/76* (2006.01)

(52) U.S. Cl. ........ 438/435; 438/222; 438/218; 438/221; 438/429; 438/413; 257/301; 257/306

(58) Field of Classification Search .............. 438/435, 438/681, 396, 424, 365, 3, 643, 240, 656, 438/648, 222, 218, 221, 429, 413
See application file for complete search history.

(56) References Cited

U.S. PATENT DOCUMENTS

| | | | |
|---|---|---|---|
| 4,468,413 | A | 8/1984 | Bachmann |
| 4,690,746 | A | 9/1987 | McInerney et al. |
| 4,851,370 | A | 7/1989 | Doklan et al. |
| 4,872,947 | A | 10/1989 | Wang et al. |
| 4,892,753 | A | 1/1990 | Wang et al. |

(Continued)

FOREIGN PATENT DOCUMENTS

EP 0 496 543 A2 7/1992

(Continued)

OTHER PUBLICATIONS

Weston, C.W. et al., "Ammonium Compounds," in Kirk-Othmer Encyclopedia of Chemical Technology, John Wiley & Sons, Inc., 2003, see pp. 717-718.

(Continued)

*Primary Examiner* — Matthew S Smith
*Assistant Examiner* — Wilner Jean Baptiste
(74) *Attorney, Agent, or Firm* — Kilpatrick Townsend and Stockton

(57) ABSTRACT

A method for forming a semiconductor structure includes forming a plurality of features across a surface of a substrate, with at least one space being between two adjacent features. A first dielectric layer is formed on the features and within the at least one space. A portion of the first dielectric layer interacts with a reactant derived from a first precursor and a second precursor to form a first solid product. The first solid product is decomposed to substantially remove the portion of the first dielectric layer. A second dielectric layer is formed to substantially fill the at least one space.

25 Claims, 10 Drawing Sheets

U.S. PATENT DOCUMENTS

| | | | |
|---|---|---|---|
| 4,894,352 A | 1/1990 | Lane et al. | |
| 4,960,488 A | 10/1990 | Law et al. | |
| 5,000,113 A | 3/1991 | Wang et al. | |
| 5,013,691 A | 5/1991 | Lory et al. | |
| 5,030,319 A | 7/1991 | Nishino et al. | |
| 5,061,838 A | 10/1991 | Lane et al. | |
| 5,089,442 A | 2/1992 | Olmer | |
| 5,156,881 A | 10/1992 | Okano et al. | |
| 5,215,787 A | 6/1993 | Homma | |
| 5,252,178 A | 10/1993 | Moslehi | |
| 5,271,972 A | 12/1993 | Kwok et al. | |
| 5,275,977 A | 1/1994 | Otsubo et al. | |
| 5,279,865 A | 1/1994 | Chebi et al. | |
| 5,288,518 A | 2/1994 | Homma | |
| 5,290,382 A | 3/1994 | Zarowin et al. | |
| 5,302,233 A | 4/1994 | Kim et al. | |
| 5,314,724 A | 5/1994 | Tsukune et al. | |
| 5,319,247 A | 6/1994 | Matsuura | |
| 5,334,552 A | 8/1994 | Homma | |
| 5,362,526 A | 11/1994 | Wang et al. | |
| 5,385,763 A | 1/1995 | Okano et al. | |
| 5,399,529 A | 3/1995 | Homma | |
| 5,413,967 A | 5/1995 | Matsuda et al. | |
| 5,416,048 A | 5/1995 | Blalock et al. | |
| 5,420,075 A | 5/1995 | Homma et al. | |
| 5,429,995 A | 7/1995 | Nishiyama et al. | |
| 5,468,342 A | 11/1995 | Nulty et al. | |
| 5,474,589 A | 12/1995 | Ohga et al. | |
| 5,505,816 A | 4/1996 | Barnes et al. | |
| 5,563,105 A | 10/1996 | Dobuzinsky et al. | |
| 5,571,576 A | 11/1996 | Qian et al. | |
| 5,599,740 A | 2/1997 | Jang et al. | |
| 5,624,582 A | 4/1997 | Cain | |
| 5,645,645 A | 7/1997 | Zhang et al. | |
| 5,648,175 A | 7/1997 | Russell et al. | |
| 5,661,093 A | 8/1997 | Ravi et al. | |
| 5,679,606 A | 10/1997 | Wang et al. | |
| 5,712,185 A | 1/1998 | Tsai et al. | |
| 5,719,085 A | 2/1998 | Moon et al. | |
| 5,756,402 A | 5/1998 | Jimbo et al. | |
| 5,804,259 A | 9/1998 | Robles | |
| 5,850,105 A | 12/1998 | Dawson et al. | |
| 5,858,876 A | 1/1999 | Chew | |
| 5,872,052 A | 2/1999 | Iyer | |
| 5,872,058 A | 2/1999 | Van Cleemput et al. | |
| 5,891,349 A | 4/1999 | Tobe et al. | |
| 5,913,140 A | 6/1999 | Roche et al. | |
| 5,915,190 A | 6/1999 | Pirkle | |
| 5,920,792 A | 7/1999 | Lin | |
| 5,937,323 A | 8/1999 | Orczyk et al. | |
| 5,939,831 A | 8/1999 | Fong et al. | |
| 5,944,902 A | 8/1999 | Redeker et al. | |
| 5,953,635 A | 9/1999 | Andideh | |
| 5,968,610 A | 10/1999 | Liu et al. | |
| 5,976,327 A | 11/1999 | Tanaka | |
| 5,990,000 A | 11/1999 | Hong et al. | |
| 5,990,013 A | 11/1999 | Berenguer et al. | |
| 6,013,191 A | 1/2000 | Nasser-Faili et al. | |
| 6,013,584 A | 1/2000 | M'Saad | |
| 6,030,666 A | 2/2000 | Lam et al. | |
| 6,030,881 A | 2/2000 | Papasouliotis et al. | |
| 6,037,018 A | 3/2000 | Jang et al. | |
| 6,039,851 A | 3/2000 | Iyer | |
| 6,059,643 A | 5/2000 | Hu et al. | |
| 6,087,278 A | 7/2000 | Kim et al. | |
| 6,099,697 A | 8/2000 | Hausmann | |
| 6,136,685 A | 10/2000 | Narwankar et al. | |
| 6,150,628 A | 11/2000 | Smith et al. | |
| 6,167,834 B1 | 1/2001 | Wang et al. | |
| 6,170,428 B1 | 1/2001 | Redeker et al. | |
| 6,182,602 B1 | 2/2001 | Redeker et al. | |
| 6,189,483 B1 | 2/2001 | Ishikawa et al. | |
| 6,190,233 B1 | 2/2001 | Hong et al. | |
| 6,191,026 B1 | 2/2001 | Rana et al. | |
| 6,194,038 B1 | 2/2001 | Rossman | |
| 6,197,705 B1 | 3/2001 | Vassiliev | |
| 6,203,863 B1 | 3/2001 | Liu et al. | |
| 6,204,200 B1 | 3/2001 | Shieh et al. | |
| 6,217,658 B1 | 4/2001 | Orczyk et al. | |
| 6,228,751 B1 | 5/2001 | Yamazaki et al. | |
| 6,313,035 B1 * | 11/2001 | Sandhu et al. | 438/681 |
| 6,335,261 B1 | 1/2002 | Natzle et al. | |
| 6,335,288 B1 | 1/2002 | Kwan et al. | |
| 6,372,657 B1 | 4/2002 | Hineman et al. | |
| 6,395,150 B1 | 5/2002 | Van Cleemput et al. | |
| 6,479,373 B2 | 11/2002 | Dreybrodt et al. | |
| 6,503,843 B1 | 1/2003 | Xia et al. | |
| 6,596,602 B2 * | 7/2003 | Iizuka et al. | 438/396 |
| 6,596,654 B1 | 7/2003 | Bayman et al. | |
| 6,602,434 B1 | 8/2003 | Hung et al. | |
| 6,677,247 B2 | 1/2004 | Yuan et al. | |
| 6,794,290 B1 | 9/2004 | Papasouliotis et al. | |
| 6,802,944 B2 | 10/2004 | Ahmad et al. | |
| 6,808,748 B2 | 10/2004 | Kapoor et al. | |
| 6,846,745 B1 | 1/2005 | Papasouliotis et al. | |
| 6,869,880 B2 | 3/2005 | Krishnaraj et al. | |
| 6,905,940 B2 | 6/2005 | Ingle et al. | |
| 6,908,862 B2 | 6/2005 | Li et al. | |
| 7,078,312 B1 | 7/2006 | Sutanto et al. | |
| 7,205,240 B2 | 4/2007 | Karim et al. | |
| 7,390,710 B2 * | 6/2008 | Derderian et al. | 438/222 |
| 2001/0028922 A1 | 10/2001 | Sandhu | |
| 2002/0187655 A1 | 12/2002 | Tan et al. | |
| 2004/0110354 A1 * | 6/2004 | Natzle et al. | 438/365 |
| 2004/0211357 A1 | 10/2004 | Gadgil et al. | |
| 2006/0264003 A1 * | 11/2006 | Eun | 438/424 |
| 2007/0123051 A1 | 5/2007 | Arghavani et al. | |
| 2008/0124919 A1 | 5/2008 | Huang et al. | |

FOREIGN PATENT DOCUMENTS

| | | |
|---|---|---|
| EP | 0658928 A1 | 6/1995 |
| JP | 61-276977 A | 12/1986 |
| JP | 2058836 A | 2/1990 |
| JP | 4-239750 | 7/1992 |
| JP | 4-341568 A | 11/1992 |
| JP | 7-161703 A | 6/1995 |
| WO | WO 9220833 A1 | 11/1992 |
| WO | WO 00/13225 A1 | 3/2000 |
| WO | WO 2004/114366 A2 | 12/2004 |

OTHER PUBLICATIONS

Australian Patent Office Search Report for Application No. SG 200718319-7, Filing Date of Dec. 4, 2007, Date of Mailing Apr. 15, 2008, 4 pages.

Abraham, "Reactive Facet Tapering of Plasma Oxide for Multilevel Interconnect Applications," VMIC Conference. pp. 115-121 (1987).

Chang et al. "Frequency Effects and Properties of Plasma Deposited Fluorinated Silicon Nitride", American Vacuum Society. 1988. pp. 524-532.

Cheng, L.-Y. et al., "New Test Structure to Identify Step Coverage Mechanisms in Chemical Vapor Deposition of Silicon Dioxide," Appl. Phys. Lett., 58 (19), May 13, 1991, p. 2147-2149.

Fukada et al. "Preparation of SiOF Films with Low Dielectric Constant by ECR Plasma CVD", Japan. DUMIC Conference. Feb. 1995. pp. 43-49.

Galiano et al. "Stress-Temperature Behavior of Oxide Films Used for Intermetal Dielectric Applications", VMIC Conference. Jun. 1992. pp. 100-106.

Hausmann, D. et al., "Rapid Vapor Deposition of Highly Conformal Nanolaminates," Science, 298, Oct. 11, 2002. p. 402-406.

Hayasaka, N. et al. "High Quality Low Dielectric Constant SiO2 CVD Using High Density Plasma," Proceedings of the Dry Process Symposium, 1993, pp. 163-168.

Laxman, "Low ϵ Dielectrics: CVD Fluorinated Silicon Dioxides", Semiconductor International. May 1995. pp. 71-74.

Lee et al., "Dielectric Planarization Techniques for Narrow Pitch Multilevel Interconnects," VMIC Conference, pp. 85-92 (1987).

Li, D. et al., "HDP-CVD dep/etch/dep Process for Improved Deposition into High Aspect Ratio Features," U.S. Patent No. 6,908,862 published Jun. 21, 2005.

Matsuda et al. "Dual Frequency Plasma CVD Fluorosilicate Glass: Deposition for 0.25 um Interlevel Dielectrics", DUMIC Conference. Feb. 1995. pp. 22-28.

Meeks et al., "Modeling of SiO 2 deposition in high density plasma reactors and comparisons of model predictions with experimental measurements," J. Vac. Sci. Technol. A, 16(2):544-563 (1998).

Musaka, "Single Step Gap Filling Technology fo Subhalf Micron Metal Spacings on Plasma Enhanced TEOS/O2 Chemical Vapor Deposition System," International Conference on Solid State Devices and Materials pp. 510-512, held in Japan, (1993).

Ota, K. et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, p. 138-139.

Qian et al., "High Density Plasma Deposition and Deep Submicron Gap Fill with Low Dielectric Constant SiO2 Films," DUMIC Conference, Feb. 21-22, 1995, pp. 50-56, held in California.

Robles et al. "Effects of RF Frequency and Deposition Rates on the Moisture Resistance of PECVD TEOS-Based Oxide Films", ECS Extended Abstracts. vol. 92-1. May 1992. pp. 215-216.

Shapiro et al. "Dual Frequency Plasma CVD Fluorosilicate Glass: Water Absorption and Stability", DUMIC Conference. Feb. 1995. pp. 118-123.

Usami et al. "Low Dielectric Constant Interlayer Using Fluorine-Doped Silicon Oxide", Jpn. J. Appl. Phys. vol. 33, Jan. 1994. pp. 408-412.

Vassiliev et al., "Trends in void-free pre-metal CVD dielectrics," Solid State Technology, Mar. 2001, pp. 129-136, www.solid-state.com.

Yu, D. et al., "Step Coverage Study of Peteos Deposition for Intermetal Dielectric Applications," abstract, VMIC conference, Jun. 12-13, 1990, 7 pages.

SG International Search Report SG 200718318-9.

Australian Patent Office Examiner's Written Opinion, SG Patent Application No. 200718319-7, 5 pages.

Australian Patent Office Examiner's Written Opinion, SG Patent Application No. 200718319-7, 5 pages. Feb. 17, 2009.

SG International Search Report SG 200718318-9, Apr. 16, 2008.

Ogawa, Hiroki, et al., "Dry Cleaning Technology for Removal of Silicon Native Oxide Employing Hot NH3/NF3 Exposure", Japanese Journal of Applied Physics, vol. 41, pp. 5349-5358.

\* cited by examiner

METHODS OF THIN FILM PROCESS

CROSS-REFERENCES TO RELATED APPLICATIONS

This application claims the benefit of U.S. Provisional Application No. 60/869,066, filed Dec. 7, 2006. This application is also related to the U.S. patent application filed on the same day as the present application 11/947,619, titled "Multstep Dep-Etch-Dep High Aspect Ratio Process for Dielectric Gapfills." The entire contents of both application are herein incorporated by reference for all purposes.

This application is related to co-assigned U.S. Provisional Patent Application No. 60/803,499 to Lubomirsky et al, filed May 30, 2006, and titled "PROCESS CHAMBER FOR DIELECTRIC GAPFILL." This application is related to co-assigned U.S. Pat. No. 6,387,207 to Janakiraman et al., issued May 14, 2002, and titled "INTEGRATION OF REMOTE PLASMA GENERATOR WITH SEMICONDUCTOR PROCESSING CHAMBER." This application is related to and co-assigned U.S. Pat. No. 6,830,624 to Janakiraman et al., issued Dec. 14, 2004, and titled "BLOCKER PLATE BY-PASS FOR REMOTE PLASMA CLEAN." This application is also related to co-assigned U.S. Pat. No. 5,558,717 to Zhao et al., and titled "CVD PROCESSING CHAMBER." The entire contents of both related applications is hereby incorporated by reference for all purposes.

BACKGROUND OF THE INVENTION

Semiconductor device geometries have dramatically decreased in size since their introduction several decades ago. Modern semiconductor fabrication equipment routinely produces devices with 250 nm, 180 nm, and 65 nm feature sizes, and new equipment is being developed and implemented to make devices with even smaller geometries. The smaller sizes, however, mean device elements have to work closer together which can increase the chances of electrical interference, including cross-talk and parasitic capacitance.

To reduce the degree of electrical interference, dielectric insulating materials are used to fill the gaps, trenches, and other spaces between the device elements, metal lines, and other device features. The aspect ratio of a gap is defined by the ratio of the gap's height or depth to its width. These spaces are difficult to fill using conventional CVD methods. A film's ability to completely fill such gaps is referred to as the film's "gapfilling" ability. Silicon oxide is one type of insulation film that is commonly used to fill the gaps in intermetal dielectric (IMD) applications, premetal dielectric (PMD) applications and shallow trench isolation (STI) applications among others. Such a silicon oxide film is often referred to as a gapfill film or a gapfill layer.

Some integrated circuit manufacturers have turned to the use of high density plasma CVD (HDP-CVD) systems to deposit silicon oxide gapfill layers. HDP-CVD systems form a plasma that is approximately two orders of magnitude or greater than the density of a standard, capacitively-coupled plasma CVD system. Examples of HDP-CVD systems include inductively-coupled plasma systems and electron cyclotron resonance (ECR) plasma systems, among others. HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gapfill capabilities as compared to films deposited in a low density plasma CVD system.

Another factor that allows films deposited by HDP-CVD techniques to have improved gapfill characteristics as compared to films deposited by other CVD techniques is the occurrence of sputtering, promoted by the plasma's high density, simultaneous with film deposition. The sputtering element of HDP deposition slows deposition on certain features, such as the corners of raised surfaces, thereby contributing to the increased gapfill ability of IDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma toward the substrate. The electric field can be applied throughout the HDP deposition process to generate sputtering and provide better gapfill characteristics for a given film. One HDP-CVD process commonly used to deposit a silicon oxide film forms a plasma from a process gas that includes silane ($SiH_4$), molecular oxygen ($O_2$) and argon (Ar).

However, a limitation associated with sputtering is an angular redistribution of sputtered material. For example, in an STI gapfill, the sputtered $SiO_2$ can be sputtered from above the trench and deposit on the sides of the trench, causing excess buildup, and limiting the opening through which bottom-up gapfill is achieved. If there is too much re-deposition, the trench can close off before the bottom is filled, leaving a buried void within the trench.

BRIEF SUMMARY OF THE INVENTION

Accordingly to an exemplary embodiment, a method for forming a semiconductor structure includes forming a plurality of features across a surface of a substrate, with at least one space being between two adjacent features. A first dielectric layer is formed on the features and within the at least one space. A portion of the first dielectric layer interacts with a reactant derived from a first precursor and a second precursor to form a first solid product. The first solid product is decomposed to substantially remove the portion of the first dielectric layer. A second dielectric layer is formed to substantially fill the at least one space.

Accordingly to an exemplary embodiment, forming a plurality of features comprises forming at least a plurality of trenches, conductive lines, openings and transistor gates.

Accordingly to an exemplary embodiment, forming the first dielectric layer includes forming a silicon oxide layer.

Accordingly to an exemplary embodiment, interacting the portion of the first dielectric layer with a reactant includes ionizing the first precursor and the second precursor; and interacting the ionized first precursor and the ionized second precursor with the portion of the first dielectric layer.

Accordingly to an exemplary embodiment, the first precursor is ammonia ($NH_3$) and the second precursor is nitrogen trifluoride ($NF_3$).

Accordingly to an exemplary embodiment, interacting the portion of the first dielectric layer with a reactant includes interacting the portion of the first dielectric layer with the ionized first precursor and the second precursor.

Accordingly to an exemplary embodiment, the first precursor is nitrogen trifluoride ($NF_3$) and the second precursor is hydrogen fluoride (HF) or ammonia ($NH_3$).

Accordingly to an exemplary embodiment, interacting the portion of the first dielectric layer with a reactant includes interacting the portion of the first dielectric layer with the first precursor and the second precursor.

Accordingly to an exemplary embodiment, the first precursor is ammonia ($NH_3$) and the second precursor is hydrogen fluoride (HF).

Accordingly to an exemplary embodiment, forming the first dielectric layer comprises forming a silicon nitride layer.

Accordingly to an exemplary embodiment, interacting the portion of the first dielectric layer with a reactant includes ionizing the first precursor and the second precursor; and interacting the portion of the silicon nitride layer with the ionized first precursor and the ionized second precursor.

Accordingly to an exemplary embodiment, the first precursor is hydrogen ($H_2$) and the second precursor is nitrogen trifluoride ($NF_3$).

Accordingly to an exemplary embodiment, decomposing the first solid product includes thermally treating the first solid product to substantially sublimate the first solid product.

Accordingly to an exemplary embodiment, the method further includes forming a liner under the first dielectric layer, wherein an etch selectivity of the first dielectric layer to the liner is about 8:1 or more.

Accordingly to an exemplary embodiment, the method further includes interacting a portion of the liner with a reactant derived from a third precursor and a fourth precursor to generate a second solid product; and decomposing the second solid product to remove the portion of the liner.

Accordingly to an exemplary embodiment, the method further includes interacting another portion of the first dielectric layer with a reactant derived from a third precursor and a fourth precursor to generate a second solid product; and decomposing the second solid product to remove the another portion of the first dielectric layer.

Accordingly to an exemplary embodiment, forming the first dielectric layer on the features and within the at least one space has a process pressure of about 600 torr or more.

Accordingly to an exemplary embodiment, decomposing the first solid product forms an angle between slanted sidewalls of the removed first dielectric layer and a bottom of the removed first dielectric layer about 87° or less.

Accordingly to an exemplary embodiment, a method for forming a semiconductor structure includes forming a plurality of trenches across a surface of a substrate. A first dielectric layer is formed on and within the trenches. A portion of the first dielectric layer interacts with a reactant derived from a first precursor and a second precursor to form a first solid product. The first solid product is thermally treated to substantially sublimate the first solid product to substantially remove the portion of the first dielectric layer. A second dielectric layer is formed to substantially fill the spaces.

Accordingly to exemplary embodiments, the steps in the above-described method may be repeated for one or more additional cycles of etching and depositing dielectric layers. For example, a portion of the second dielectric layer deposited at the end of the above-described method may further interact with the reactant to form a second solid product that is sublimated in a thermal treatment to remove that portion of the second dielectric layer. A third dielectric layer may be formed on the remaining (i.e., non-etched) portion of the second dielectric layer. Additional etching and dielectric deposition cycles may be performed until a final dielectric layer is deposited that substantially fills the remaining spaces (e.g., a dielectric cap layer).

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Systems and methods are described for forming at least one dielectric layer over at least one feature, e.g., transistor gate, formed across a surface of a substrate. A portion of the dielectric layer interacts with a reactant derived from a first precursor and a second precursor to form a solid product. The solid product can be decomposed so as to substantially remove the portion of the dielectric layer. Another dielectric layer then may be formed over the etched dielectric layer, such that the aspect ratio gaps and/or trenches may be filled with dielectric materials substantially without gaps or seams.

Exemplary Processes

FIGS. 1A-1D are schematic drawings showing an exemplary process method for forming an exemplary shallow trench isolation structure. FIG. 2 is a schematic drawing showing an exemplary flowchart of forming an exemplary shallow trench isolation structure.

Figure 1A:
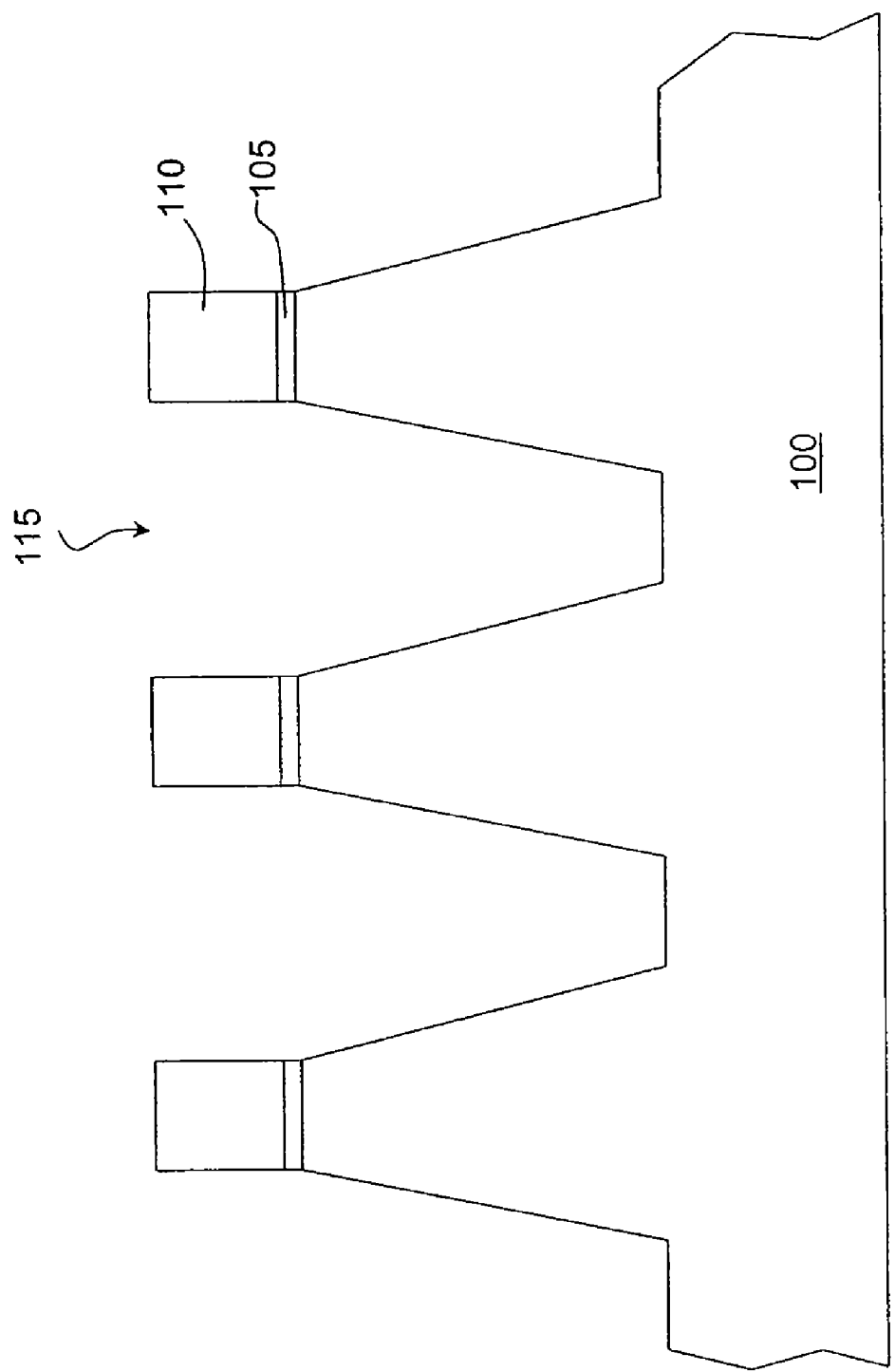
FIGS. 1A-1D are schematic drawings showing an exemplary process method for forming an exemplary shallow trench isolation structure.
Figure 2:
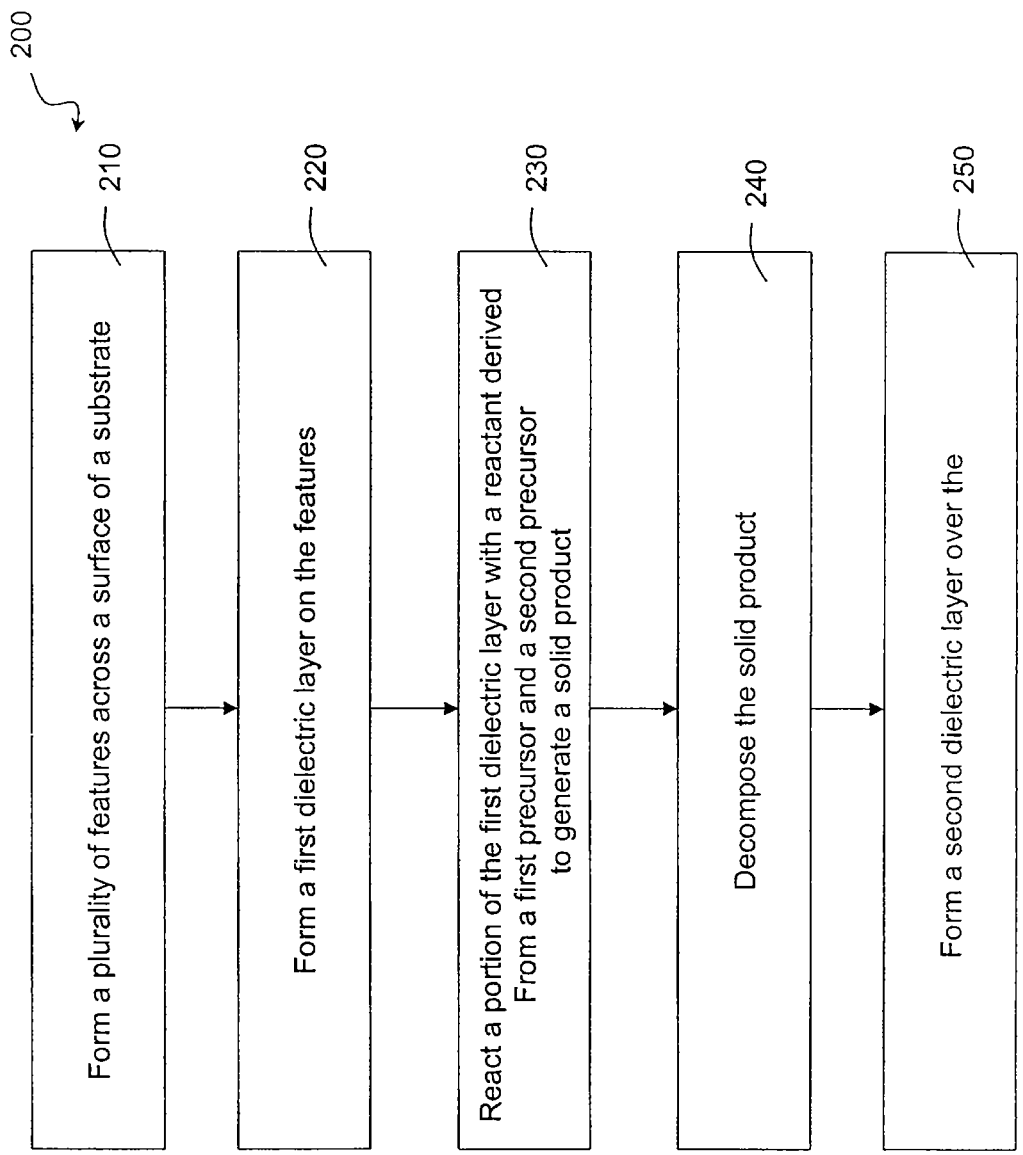
FIG. 2 is a schematic drawing showing an exemplary flowchart of forming an exemplary shallow trench isolation structure.

Referring to FIG. 1A, at least one feature 115 is formed across a surface of a substrate 100. The features 115 can be, for example, transistors, transistor gates, trenches, openings, gaps, conductive lines or other feature that has an aspect ratio of about 5:1 or more. In some embodiments, the features 115 can be trenches. The trenches 115 can be formed across the substrate 100. The substrate 100 may be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, the substrate 100 may be a semiconductor wafer (e.g., a 200 mm, 300 mm, 400 mm, etc. silicon wafer).

Referring to FIG. 2, an exemplary process 200 for forming an shallow trench isolation structure can include steps 210-250. Step 210 can form a plurality of features 115 across a surface of the substrate 100.

Referring again to FIG. 1A, at least one pad dielectric layer 105, such as pad oxide, can be formed over the substrate 100. In some embodiments, at least one pad dielectric layer 110, such as pad nitride, can be formed over the pad oxide 105. The pad dielectric layers 105 and 110 can be formed, for example, by a chemical vapor deposition (CVD) process, a thermal process and/or other process that can desirably form a dielectric film layer. In some embodiments, the trenches 115 can be formed by an etch process which removes portions of the pad dielectric layers 105, 110 and the substrate 100. In some embodiments, the pad dielectric layer 105 is nitride and the pad dielectric layer 110 is oxide. In some embodiments, the pad dielectric layers 105 and 110 can be different dielectric materials which have a desired etch selectivity.

Figure 1B:
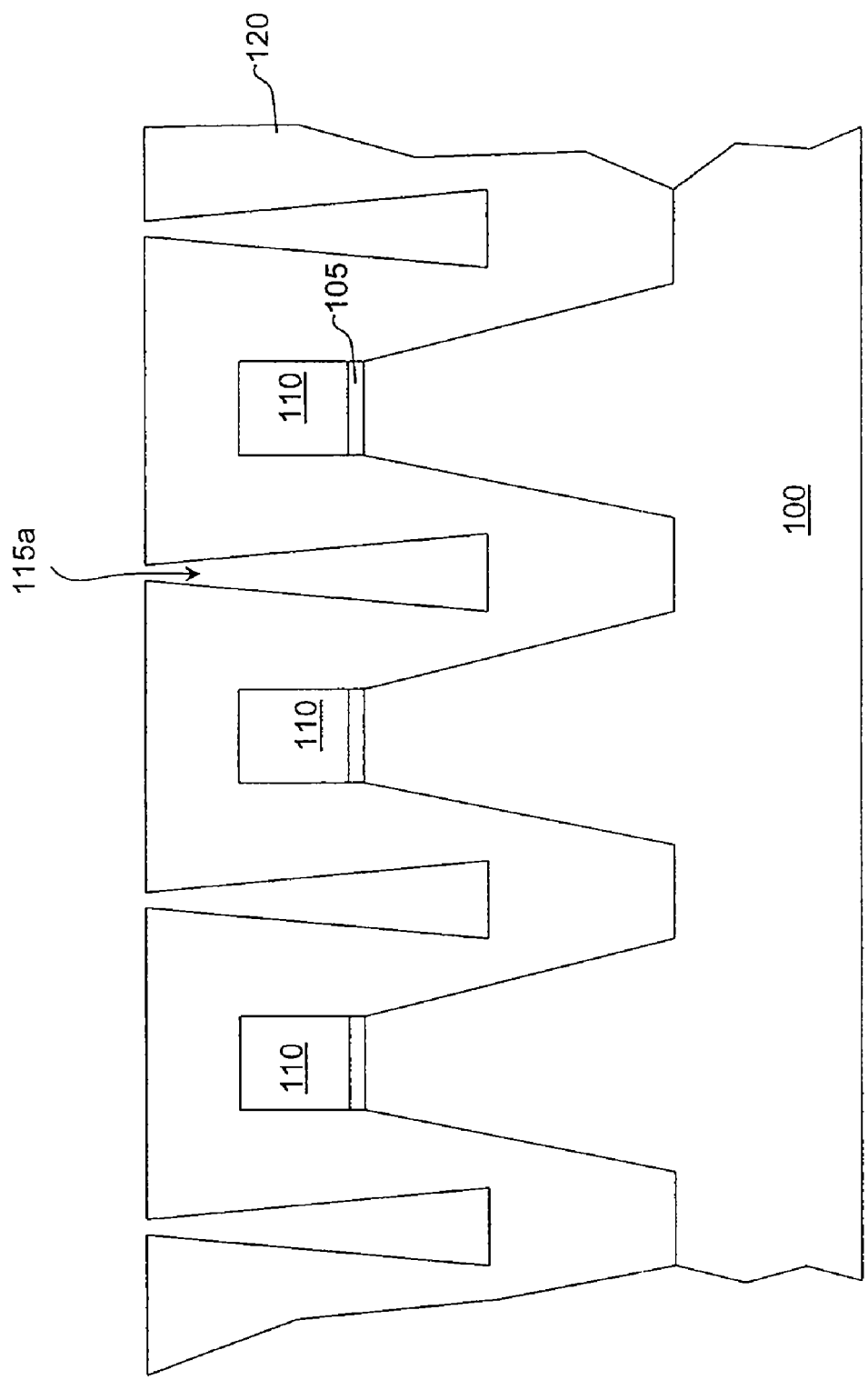

Referring to FIGS. 1B and 2, step 220 can form at least one dielectric layer, such as dielectric layer 120, over the trenches 115. The dielectric layer 120 can reduce the dimensions of the trenches 115 to those of trenches 115a. The dielectric layer 120 can include at least one of a silicon oxide layer, a silicon nitride layer, silicon oxynitride layer, a silicon oxycarbide layer and other dielectric layer. In some embodiments, the dielectric layer 120 can be thermal CVD oxide, such as high aspect ratio process (HARP) oxide, eHARP oxide, atmosphere pressure CVD (APCVD) oxide, or high temperature undoped silicate glass (HTUSG); high density plasma (HDP) oxide; plasma-enhanced CVD (PECVD) oxide; furnace deposited oxide, such as high temperature oxide, medium temperature oxide or low temperature oxide; atomic layer deposition (ALD) oxide, and other oxide. In some embodiments, the dielectric layer 120 can be, for example, PECVD nitride, furnace deposited nitride, HDP nitride, thermal CVD nitride, ALD nitride, and other nitride. In some embodiments, the dielectric layer 120 may be referred to as a high aspect ratio process (HARP) liner. In some embodiments, the step 220 may have a process pressure of about 600 torrs or more.

In some embodiments, the dielectric layer 120 may be formed from a silicon-containing precursor such as silane ($SiH_4$), dichlorosilane ($SiH_2Cl_2$), tricholorosilane ($SiHCl_3$), and silicontetrachloride ($SiCl_4$) and a nitrogen-containing precursor, such as nitrogen ($N_2$) and ammonia ($NH_3$). In some embodiments, the dielectric layer 125 may be formed from a silicon-containing precursor such as alkoxy disilanes, alkoxy-alkyl disilanes, alkoxy-acetoxy disilanes and polysilanes; and a nitrogen-containing precursor such as nitrogen and ammonia. For example, the alkoxy disilanes may include $Si_2(EtO)_6$ ethoxy disilanes, $Si_2(MeO)_6$ methoxy disilanes, and $Si_6(MeO)_{12}$ methoxy cyclohexylsilanes, where Et denotes ethyl group ($C_2H_6$) and Me denotes methyl group ($CH_3$). In some embodiments, the alkoxy-alkyl disilanes may include $Si_2(EtO)_4(Me)_2$ tetraethoxy-dimethyl disilanes, $Si_2(EtO)_4(Et)_2$ tetraethoxy-diethyl disilanes, $Si_2(EtO)_2(Me)_4$ diethoxy-tetramethyl disilanes, $Si_2(MeO)_4(Me)_2$ tetramethoxy-dimethyl disilanes, and $Si_4O_2(Me)_8$ methyl cyclohexylsiloxanes, $Si_6(MeO)_6(Me)_6$ methoxy-methyl cyclohexylsilanes, $Si_4O_2(H_2)_4$ hydro-cyclohexylsilanes. In some embodiments, the alkoxy-acetoxy disilanes may include $Si_2(AcO)_6$ acetoxy disilanes, $Si_2(Me)_4(AcO)_2$ tetramethyl-diacetoxy disilanes, and $Si_2(Me)_2(AcO)_4$ dimethyl-tetracetoxy disilanes, where Ac denotes acetyl group. In some embodiments, the polysilanes may include cyclopentylsilanes or other subinstitutes.

In some embodiments, the dielectric layer 120 can be formed over the pad dielectric layer 110, such that the trenches 115a may have a top gap smaller than the middle and/or bottom gap of the trenches 115a.

Figure 1C:
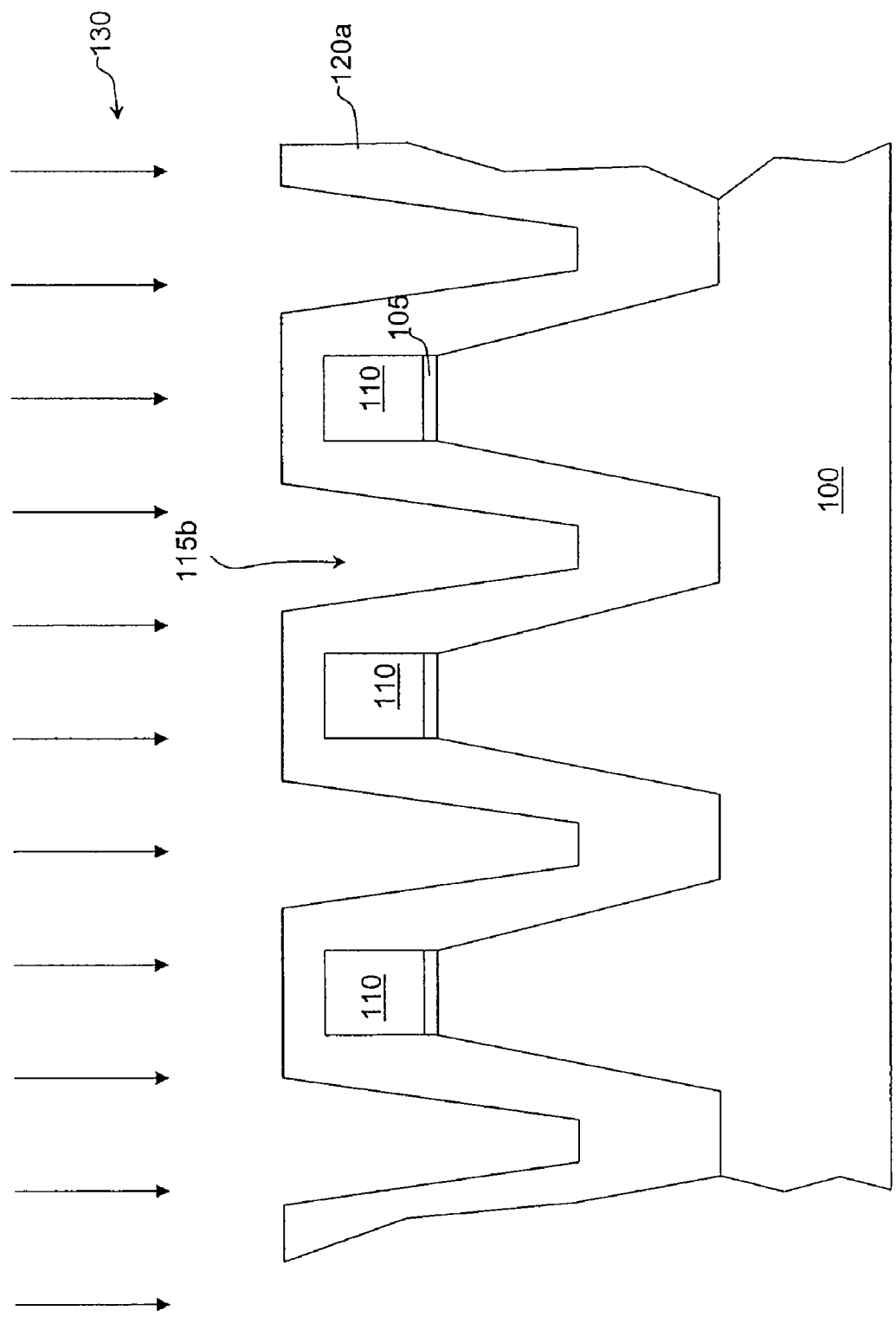

Referring to FIG. 1C, an etch process 130 can remove a portion of the dielectric layer 120, such that the etched dielectric layer 120a can have tapered sidewalls along the trenches 115b. In some embodiments, the etch process 130 can include steps 230, and 240 shown in FIG. 2. Step 230 may interact a portion of the dielectric layer 120 with a reactant to form a solid product. Step 240 can decompose the solid product to remove the interacted portion of the dielectric layer 120, resulting the dielectric layer 120a. Following are exemplary embodiments of the etch process 130.

Exemplary Embodiment 1

In some embodiments, the dielectric layer 120 can be a silicon oxide layer. A first precursor can be, for example, hydrogen ($H_2$), ammonia ($NH_3$), hydrazine ($N_2H_4$), hydrazoic acid ($HN_3$), other hydrogen-containing precursor and various combinations thereof A second precursor can be, for example, nitrogen trifluoride ($NF_3$), silicon tetrafluorid ($SiF_4$), tetrafluoromethane ($CF_4$), fluoromethane ($CH_3F$), difluoromethane ($CH_2F_2$), trifluoromethane ($CHF_3$), octafluoropropane ($C_3F_8$), hexafluoroethane ($C_2F_6$), other fluorine-containing precursor or various combinations thereof. In some embodiments, the first precursor such as ammonia ($NH_3$) and the second precursor such as nitrogen trifluoride ($NF_3$) can be ionized as a plasma. In some embodiments, the ionization process can be performed within the chamber that deposits the dielectric layer 120. In some embodiments, the ionization process can be occurred externally and then introduced into the chamber that deposits the dielectric layer 120. In some embodiments, the etch process 130 can be performed within an etch chamber different from the deposition chamber. In some embodiments, the etch process 130 may form an angle between slanted sidewalls of the trenches 115b and a bottom of the trenches 115b about 87° or less.

In some embodiments, $NH_3$ may have a flow rate between about 10 standard cubic centimeter per minute (sccm) and about 1,000 sccm. In some embodiments, $NH_3$ may have a flow rate of about 100 sccm. $NF_3$ can have a flow rate between about 10 sccm and about 1,000 sccm. In some embodiments, $NF_3$ may have a flow rate of about 100 sccm. The process temperature can be between about 0° C. and about 80° C. In some embodiment, the process temperature can be about 30° C. The process pressure can be between about 1 millitorr (mTorr) and about 1 atm. In some embodiments, the process pressure can be 3 Torrs. The plasma power can be between about 10 Watts and about 2,000 Watts. In some embodiments, the plasma power can be about 45 Watts. The interaction of plasma of $NH_3$ and $NF_3$ can be represented by the formula described below:

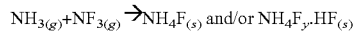

$$NH_{3(g)} + NF_{3(g)} \rightarrow NH_4F_{(s)} \text{ and/or } NH_4F_y \cdot HF_{(s)}$$

The reactant, $NH_4F_{(s)}$ and/or $NH_4F_y \cdot HF_{(s)}$, then can be introduced to interact with a portion of the silicon oxide layer. The reactant, $NH_4F_{(s)}$ and/or $NH_4F_y \cdot HF_{(s)}$, may interact with silicon oxide to form a solid product, e.g., $(NF_4)_2SiF_6$. In some embodiments, the substrate 100 is disposed over a pedestal having a temperature between about −100° C. and about 1,000° C. (e.g., about −50° C. to about 200° C.). In other embodiments, the pedestal may have a temperature of about 30° C. The temperature of the pedestal may desirably enhance the interaction of the plasma and silicon nitride. The interaction of the silicon oxide and the reactant, $NH_4F_{(s)}$ and/or $NH_4F_y \cdot HF_{(s)}$, can be described as the following formula:

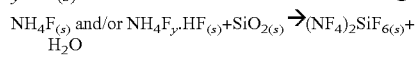

$$NH_4F_{(s)} \text{ and/or } NH_4F_y \cdot HF_{(s)} + SiO_{2(s)} \rightarrow (NF_4)_2SiF_{6(s)} + H_2O$$

Referring again to FIG. 2, step 240 can decompose the solid product, $(NF_4)_2SiF_6$. In some embodiments, step 240 can include thermally treating the solid product to substantially sublimate the solid product $(NF_4)_2SiF_6$. In some embodiments, the thermal process may be carried out by approaching the solid product $(NF_4)_2SiF_6$ to a showerhead, which may be operative to provide a process temperature between about −100° C. and about 1,000° C. (e.g., about −50° C. to about 200° C.). In an embodiment, the process temperature is about 180° C. In other embodiments, the thermal process may be carried out by, for example, an oven, a furnace, a rapid thermal anneal (RTA) apparatus, or other thermal apparatus. The decomposition and/or sublimation of the solid product $(NF_4)_2SiF_6$ may be described as the following formula:

$$(NF_4)_2SiF_{6(s)} \rightarrow SiF_{4(g)} + NH_{3(g)} + HF_{(g)}$$

Additional embodiments of a method to remove the solid product may include the steps of rinsing the product containing substrate with an aqueous solution (e.g., purified water) in lieu of sublimating the product with a thermal treatment. The substrate may also be rinsed with a polar solvent such as ethanol or glycol in lieu of (or in addition to) the aqueous solution rinse.

Exemplary Embodiment 2

In some embodiments, the dielectric layer 120 can be a silicon oxide layer. A first precursor can be, for example, hydrogen ($H_2$), ammonia ($NH_3$), hydrazine ($N_2H_4$), hydrazoic acid ($HN_3$), other hydrogen-containing precursor and various combinations thereof A second precursor can be, for example, hydrogen fluoride (HF), nitrogen trifluoride ($NF_3$), silicon tetrafluorid ($SiF_4$), tetrafluoromethane ($CF_4$), fluoromethane ($CH_3F$), difluoromethane ($CH_2F_2$), trifluoromethane ($CHF_3$), octafluoropropane ($C_3F_8$), hexafluoroethane ($C_2F_6$), other fluorine-containing precursor or various combinations thereof. In some embodiments, the first precursor such as ammonia ($NH_3$) and the second precursor such as hydrogen fluoride (HF) can be used to interact with the dielectric layer 120. In some embodiments, $NH_3$ and HF can be introduced within the chamber that deposits the dielectric layer 120. In some embodiments, $NH_3$ and HF can be introduced within an etch chamber different from the deposition chamber so as to interact with the dielectric layer 120.

In some embodiments, $NH_3$ may have a flow rate between about 10 standard cubic centimeter per minute (sccm) and about 1,000 sccm. In some embodiments, $NH_3$ may have a flow rate of about 100 sccm. HF can have a flow rate between about 10 sccm and about 2,000 sccm. In some embodiments, HF may have a flow rate of about 200 sccm. The process temperature can be between about 0° C. and about 80° C. In some embodiment, the process temperature can be about 30° C. The process pressure can be between about 1 millitorr (mTorr) and about 1 atm. In some embodiments, the process pressure can be 3 Torrs. The interaction of $NH_3$ and HF may be represented as the formula described below:

$$NH_{3(g)} + HF_{(g)} \rightarrow NH_4F_{(s)} \text{ and/or } NH_4F_y \cdot HF_{(s)}$$

In some embodiments, $NH_3$ and HF can be introduced into the chamber for interacting with a portion of the silicon oxide layer. $NH_3$ and HF may interact with silicon oxide to form a solid product, e.g., $(NF_4)_2SiF_{6(s)}$. In some embodiments, the substrate 100 is disposed over a pedestal having a temperature between about −100° C. and about 1,000° C. (e.g., about −50° C. to about 200° C.). In other embodiments, the pedestal may have a temperature of about 30° C. The temperature of the pedestal may desirably enhance the interaction of the plasma and silicon nitride. The interaction of the silicon oxide and the plasma can be described as the following formula:

$$NH_4F_{(s)} \text{ and/or } NH_4F_y \cdot HF_{(s)} + SiO_{2(s)} \rightarrow (NF_4)_2SiF_{6(s)} + H_2O$$

Referring again to FIG. 2, step 240 can decompose the solid product, $(NF_4)_2SiF_6$. In some embodiments, step 240 can include thermally treating the solid product to substantially sublimate the solid product $(NF_4)_2SiF_6$. In some embodiments, the thermal process may be carried out by approaching the solid product $(NF_4)_2SiF_6$ to a showerhead, which may be operative to provide a process temperature between about −100° C. and about 1,000° C. (e.g., about −50° C. to about 200° C.). In an embodiment, the process temperature is about 180° C. In other embodiments, the thermal process may be carried out by, for example, an oven, a furnace, a rapid thermal anneal (RTA) apparatus, or other thermal apparatus. The decomposition and/or sublimation of the solid product $(NF_4)_2SiF_6$ may be described as the following formula:

$$(NF_4)_2SiF_{6(s)} \rightarrow SiF_{4(g)} + NH_{3(g)} + HF_{(g)}$$

As noted above additional embodiments of the method to remove the solid product may include the step of rinsing the product containing substrate with an aqueous solution (e.g., purified water) in lieu of (or in addition to) sublimating the product with a thermal treatment. The substrate may also be rinsed with a polar solvent such as ethanol or glycol in lieu of (or in addition to) the aqueous solution rinse.

EXEMPLARY EMBODIMENT 3

In some embodiments, the dielectric layer 120 can be a silicon nitride layer. A first precursor can be, for example, hydrogen ($H_2$), ammonia ($NH_3$), hydrazine ($N_2H_4$), hydrazoic acid ($HN_3$), other hydrogen-containing precursor and various combinations thereof. A second precursor can be, for example, hydrogen fluoride (HF), nitrogen trifluoride ($NF_3$), silicon tetrafluorid ($SiF_4$), tetrafluoromethane ($CF_4$), fluoromethane ($CH_3F$), difluoromethane ($CH_2F_2$), trifluoromethane ($CHF_3$), octafluoropropane ($C_3F_8$), hexafluoroethane ($C_2F_6$), other fluorine-containing precursor or various combinations thereof. A first precursor such as hydrogen ($H_2$) and a second precursor such as nitrogen trifluoride ($NF_3$) can be ionized as a plasma. In some embodiments, the ionization process can be occurred within the chamber that deposits the dielectric layer 120. In some embodiments, the ionization process can be occurred externally and then introduced into the chamber that deposits the dielectric layer 120. In some embodiments, the etch process 130 can be performed within an etch chamber different from the deposition chamber.

In some embodiments, $NF_3$ may have a flow rate between about 10 standard cubic centimeter per minute (sccm) and about 1,000 sccm. In some embodiments, $NF_3$ may have a flow rate of about 100 sccm. $H_2$ can have a flow rate between about 10 sccm and about 3,000 sccm. In some embodiments, $H_2$ may have a flow rate of about 600 sccm. The process temperature can be between about 0° C. and about 80° C. In some embodiment, the process temperature can be about 30° C. The process pressure can be between about 1 millitorr (mTorr) and about 1 atm. In some embodiments, the process pressure can be 3 Torrs. The plasma power can be between about 10 Watts and about 2,000 Watts. In some embodiments, the plasma power can be about 45 Watts.

The plasma then may be introduced into the chamber for etching portions of the silicon oxide layer. The remote-generated plasmas may interact with silicon oxide to form a solid product, e.g., $(NF_4)_2SiF_6$. In some embodiments, the substrate 100 is disposed over a pedestal having a temperature between about −100° C. and about 1,000° C. (e.g., about −50° C. to about 200° C.). In other embodiments, the pedestal may have a temperature of about 30° C. The temperature of the pedestal may desirably enhance the interaction of the plasma and silicon nitride. The interaction of the silicon oxide and the plasma can be described as the following formula:

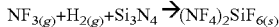

Referring again to FIG. 2, step 240 can decompose the solid product, $(NF_4)_2SiF_6$. In some embodiments, step 240 can include thermally treating the solid product to substantially sublimate the solid product $(NF_4)_2SiF_6$. In some embodiments, the thermal process may be carried out by approaching the solid product $(NF_4)_2SiF_6$ to a showerhead, which may be operative to provide a process temperature between about −50° C. and about 1,000° C. In an embodiment, the process temperature is about 180° C. In other embodiments, the thermal process may be carried out by, for example, an oven, a furnace, a rapid thermal anneal (RTA) apparatus, or other thermal apparatus. The decomposition and/or sublimation of the solid product $(NF_4)_2SiF_6$ may be described as the following formula:

As noted above additional embodiments of the method to remove the solid product may include the step of rinsing the product containing substrate with an aqueous solution (e.g., purified water) in lieu of (or in addition to) sublimating the product with a thermal treatment. The substrate may also be rinsed with a polar solvent such as ethanol or glycol in lieu of (or in addition to) the aqueous solution rinse.

Referring again to FIG. 1C, the pinch-off and the negative profile of the dielectric layer 120 may be substantially eliminated. The etched dielectric layer 120a may have a desired profile, such that a subsequent dielectric layer such as dielectric layer 140 (shown in FIG. 1D) can be desirably formed within the trenches 115b.

Figure 1D:
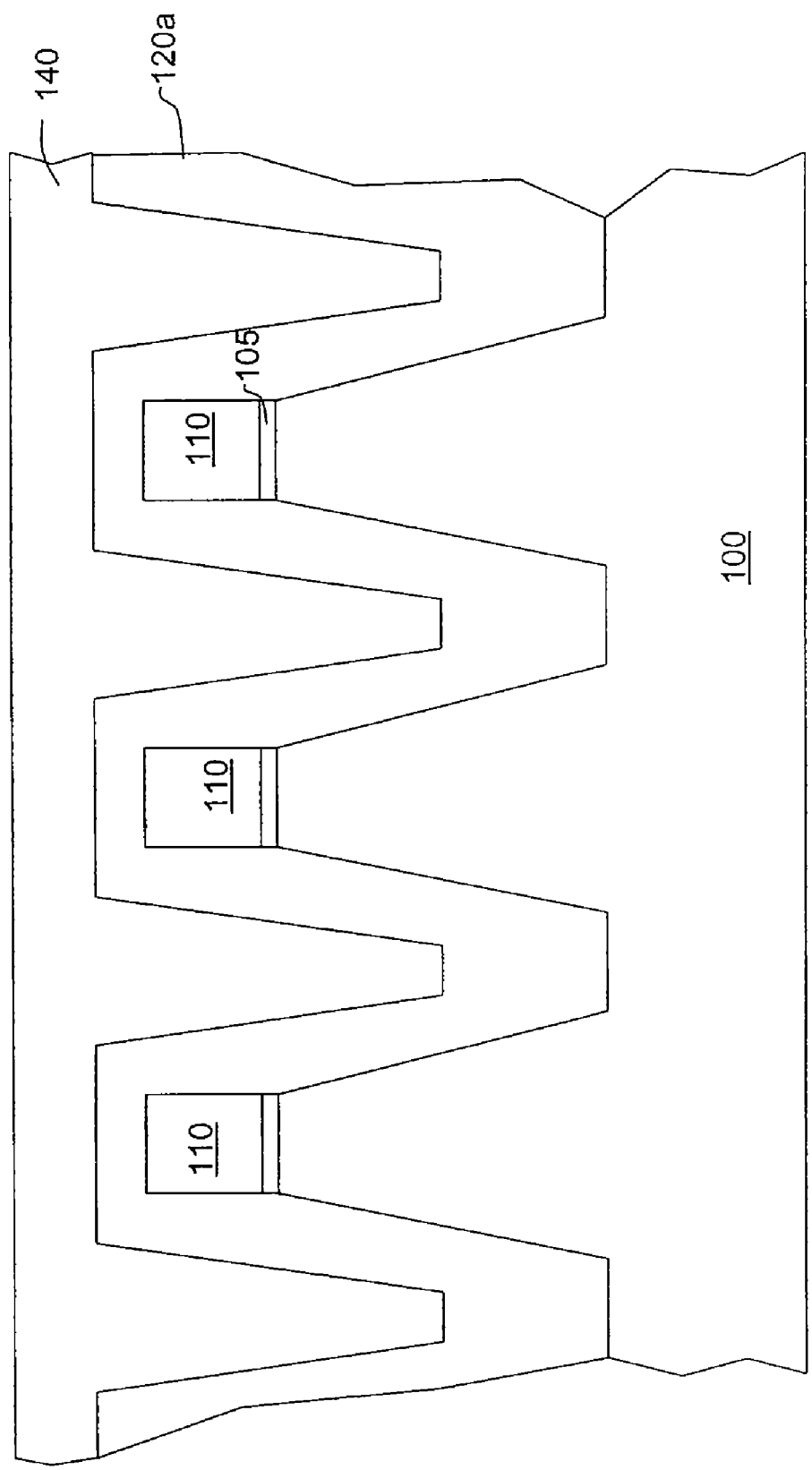

Referring to FIGS. 1D and 2, step 250 can form a dielectric layer 140 over the etched dielectric layer 120a. The dielectric layer 140 may be formed of, for example, oxide, nitride, oxynitride, low-k dielectric material, ultra low-k dielectric material, other dielectric material or various combinations thereof. The dielectric layer 140 may be formed by, for example, a CVD process, a spin-coating process, other method that is adapted to form a dielectric layer or various combinations thereof. In some embodiments, the dielectric layer 140 can be thermal CVD oxide, such as high aspect ratio process (HARP) oxide, eHARP oxide, atmosphere pressure CVD (APCVD) oxide, or high temperature undoped silicate glass (HTUSG), high density plasma (HDP) oxide, plasma-enhanced CVD (PECVD) oxide, furnace deposited oxide, such as high temperature oxide, medium temperature oxide or low temperature oxide, atomic layer deposition (ALD) oxide, and other oxide. In some embodiments, the dielectric layer 140 can be, for example, PECVD nitride, furnace deposited nitride, HDP nitride, thermal CVD nitride, ALD nitride, and other nitride. In some embodiments, the dielectric layer 140 may be referred to as a high aspect ratio process (HARP) cap layer. Since the pinch-off and negative profile of the dielectric layer 120 (shown in FIG. 1B) is substantially removed, the dielectric layer 140 may be desirably filled within the gap between the etched dielectric layer 120a.

In some embodiments, an etch-back process and/or chemical mechanical planarization (CMP) process is performed to substantially planarize the top surface of the dielectric layer 140.

Figure 3:
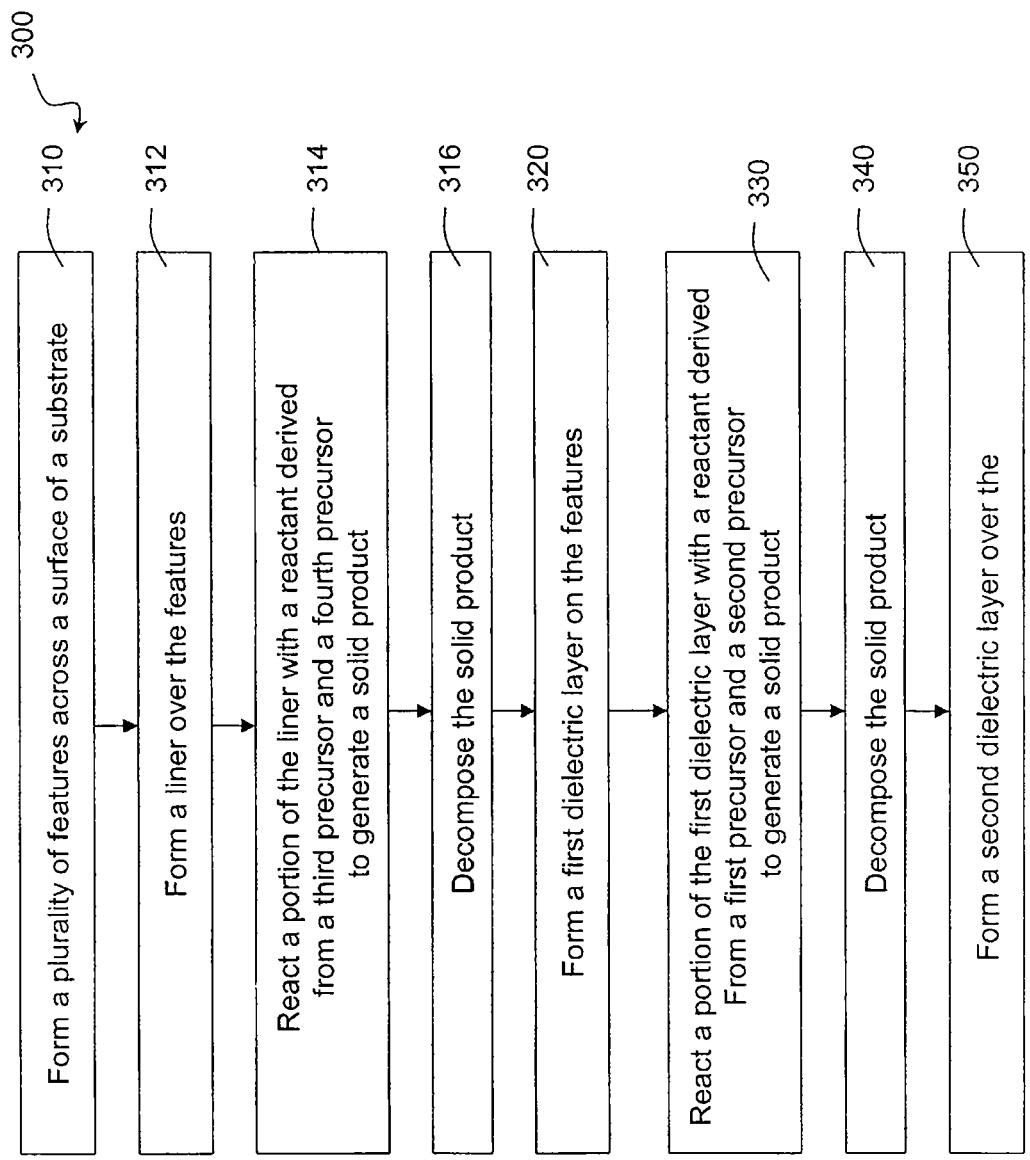
FIG. 3 is a schematic flowchart of an exemplary process for forming an exemplary trench isolation structure.

FIG. 3 is a schematic flowchart of an exemplary process for forming an exemplary trench isolation structure. Referring to FIG. 3, steps 310, 320, 330, 340, and 350 are similar to steps 210, 220, 230, 240, and 250 described above in conjunction with FIG. 2, respectively.

In FIG. 3, step 312 may form a liner before forming the dielectric layer 120. In some embodiments, the liner can include at least one of a silicon oxide layer, a silicon nitride layer, a silicon oxynitride layer, a silicon oxycarbide layer and other dielectric layer. In some embodiments, an etch process may have an etch selectivity of the dielectric layer 120 to the liner about 8:1 or more.

In some embodiments, the liner is oxide and the dielectric layer 120 is nitride. For embodiments using plasma reaction, the etch selectivity of the dielectric layer 120 to the liner can be modified by changing process temperatures, plasma powers, $NF_3$ flow rates, $NH_3$ flow rates and/or process pressure. For embodiments without using plasma reaction, the etch selectivity of the dielectric layer 120 to the liner can be modified by changing process temperatures, $NH_3$ flow rates, HF flow rates and/or process pressure.

In some embodiments, the liner is nitride and the dielectric layer 120 is oxide. For embodiments using plasma reaction, the etch selectivity of the dielectric layer 120 to the liner can be modified by changing process temperatures, plasma powers, $NF_3$ flow rates, $H_2$ flow rates and/or process pressure.

Referring again to FIG. 3, step 314 can interact the liner with a reactant derived from a third precursor and a fourth precursor to form a solid product. In some embodiments, step 314 can be similar to step 230 set forth above in conjunction with FIG. 2. Step 316 can decompose the solid product to remove a portion of the liner. In some embodiments, step 316 can be similar to step 240 described above in conjunction with FIG. 2.

In some embodiments, steps 314, and 316 can remove a portion of the liner, such that the etched liner may provide a desired profile over which the dielectric layer 120 (shown in FIG. 1A) can be formed. By using steps 314, and 316 to etch a portion of the liner, the pinch-off and the negative profile of the dielectric layer 120 may be desirably eliminated.

Figure 4:
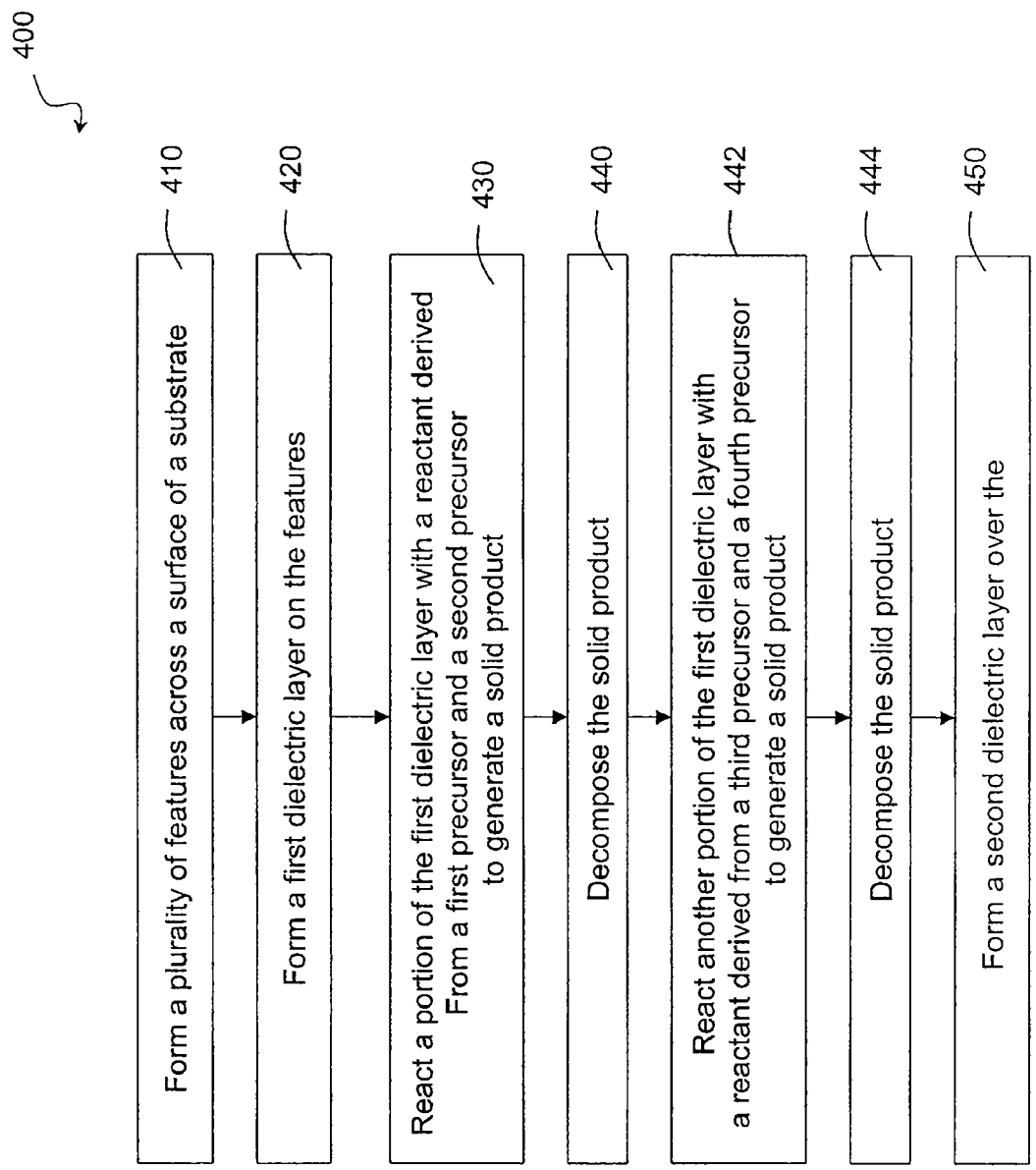
FIG. 4 is a schematic flowchart of an exemplary process for forming an exemplary trench isolation structure.

FIG. 4 is a schematic flowchart of an exemplary process for forming an exemplary trench isolation structure. Referring to FIG. 4, steps 410, 420, 430, 440, and 450 are similar to steps 210, 220, 230, 240, and 250 described above in conjunction with FIG. 2, respectively.

In FIG. 4, step 442 can interact another portion of the etched dielectric layer 120a with a reactant derived from a third precursor and a fourth precursor to form a solid product. In some embodiments, step 442 may be similar to step 230 described above in conjunction with FIG. 2. Step 444 can decompose the solid product to remove the interacting portion of the etched dielectric layer 120a. In some embodiments, step 444 may be similar to step 240 described above in conjunction with FIG. 2.

In some embodiments, steps 442, and 444 can remove a portion of the etched dielectric layer 120a, such that the etched dielectric layer 120a may provide a desired profile over which the dielectric layer 140 (shown in FIG. 1A) can be formed. By using steps 442, and 444 to etch a portion of the etched dielectric layer 120a, the pinch-off and the negative profile of the dielectric layer 120 can be desirably eliminated. In some embodiments, steps 442, and 444 can be repeated for one or more times to achieve a desired profile of the etched dielectric layer 120a.

It is noted that the present invention is not limited to the embodiments described above in conjunction with FIGS. 1A-1D and 2-4. Other methods for desirably filling dielectric layers within gaps or openings of semiconductor substrates can be modified based on the exemplary embodiments set forth above. For example, steps 312-316 shown in FIG. 3 may be incorporated with steps 442-444 shown in FIG. 4 to desirably fill dielectric layers within gaps or openings of semiconductor substrates.

Exemplary Film Deposition System

Deposition systems that may deposit a dielectric layer may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement embodiments of the invention include the CENTURA ULTIMA™ HDP-CVD chambers/systems, and PRODUCER™ PECVD chambers/systems such as PRODUCER™ Celera™ PECVD, available from Applied Materials, Inc. of Santa Clara, Calif.

Examples of substrate processing systems that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 5A:
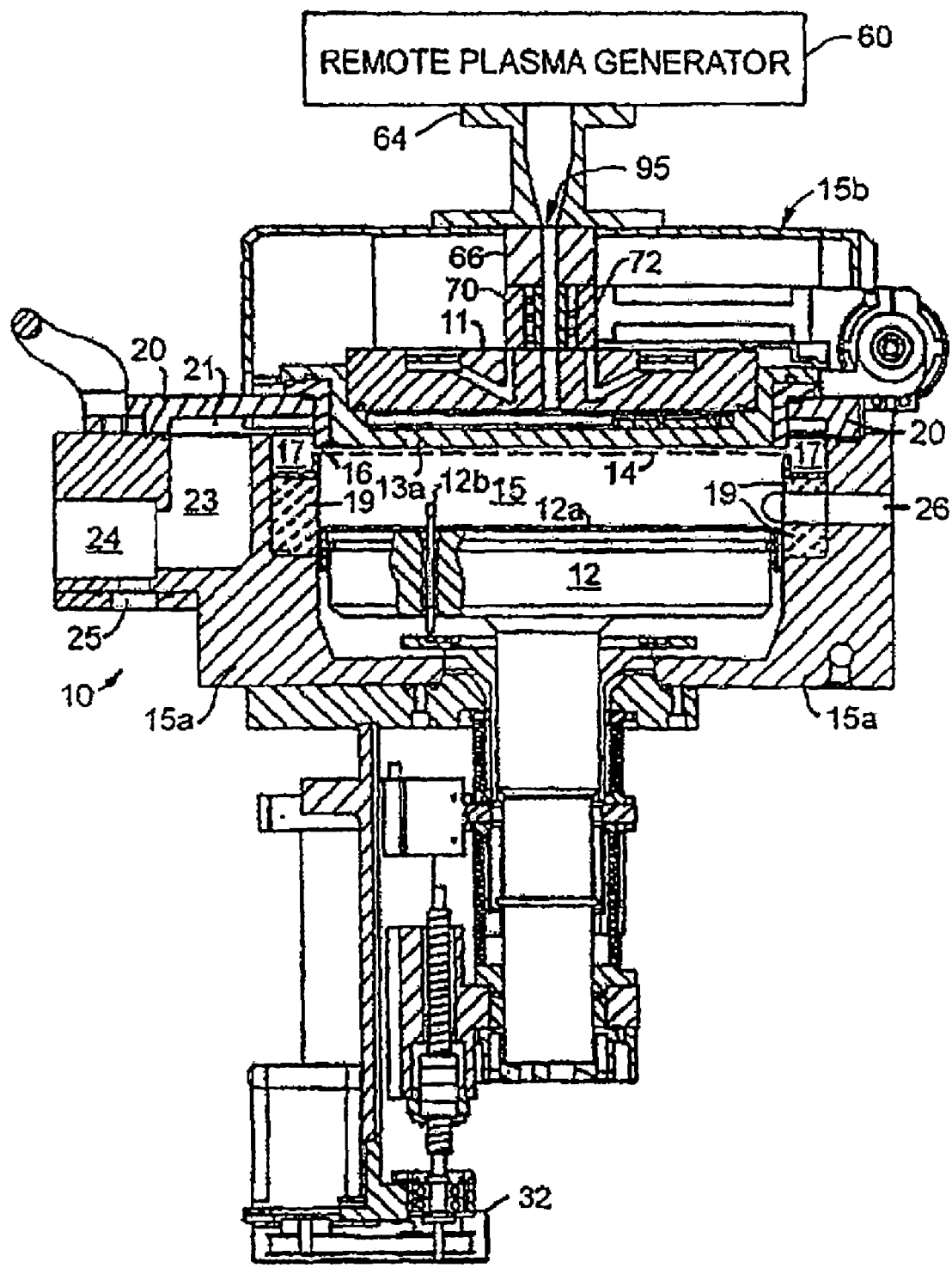
FIG. 5A shows a vertical cross-sectional view of an exemplary thin film deposition system.

Referring now to FIG. 5A, vertical cross-sectional views of a CVD system 10 is shown that has a vacuum or processing chamber 15 that includes a chamber wall 15a and a chamber lid assembly 15b. The CVD system 10 may contain a gas distribution manifold 11 for dispersing process gases to a substrate (not shown) that can rest on a heated pedestal 12 centered within the process chamber 15. Gas distribution manifold 11 may be formed from an electrically conducting material in order to serve as an electrode for forming a capacitive plasma. During processing, the substrate (e.g. a semiconductor wafer) can be positioned on a flat (or slightly convex) surface 12a of the pedestal 12. The pedestal 12 can be moved controllably between a lower loading/off-loading position (depicted in FIG. 5A) and an upper processing position (indicated by dashed line 14 in FIG. 5A), which is closely adjacent to the manifold 11. A centerboard (not shown) may include sensors for providing information on the position of the wafers.

Deposition and carrier gases can be introduced into the chamber 15 through perforated holes of a conventional flat, circular gas distribution faceplate 13a. In some embodiments, deposition process gases can flow into the chamber through the inlet manifold 11, through a conventional perforated blocker plate and then through holes in gas distribution faceplate 13a.

Before reaching the manifold 11, deposition and carrier gases can be input from gas sources through gas supply lines into a mixing system where they can be combined and then sent to manifold 11. In some embodiments, the supply line for each process gas can include (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be a thermal process and/or a plasma-enhanced process. In a plasma-enhanced process, an RF power supply can apply electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply can be a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply 44 would not be utilized, and the process gas mixture can thermally react to deposit the desired films on the surface of the semiconductor wafer supported on the pedestal 12, which is resistively heated to provide thermal energy for the reaction.

During a plasma-enhanced deposition process, the plasma can heat the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. The passages in the remainder of the chamber walls 15a are not shown. Fluids used to heat the chamber walls 15a can include the typical fluid types, i.e., water-based ethylene glycol or oil-based thermal transfer fluids. This heating (referred to as heating by the "heat exchanger") can desirably reduce and/or eliminate condensation of undesirable reactant products and improve the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). In some embodiments, the gases can be exhausted through an annular, slot-shaped orifice 16 surrounding the reaction region and into an annular exhaust plenum 17. The annular slot 16 and the plenum 17 can be defined by the gap between the top of the chamber's cylindrical side wall 15a (including the upper dielectric lining 19 on the wall) and the bottom of the circular chamber lid 20. The 360.degree. circular symmetry and uniformity of the slot orifice 16 and the plenum 17 can be configured to achieve a uniform flow of process gases over the wafer so as to deposit a uniform film on the wafer.

From the exhaust plenum 17, the gases may flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) can be resistively heated using an embedded single-loop embedded heater element configured to make two full turns in the form of parallel concentric circles. An outer portion of the heater element can run adjacent to a perimeter of the support platter, while an inner portion runs on the path of a concentric circle having a smaller radius. The wiring to the heater element can pass through the stem of the pedestal 12.

Typically, any or all of the chamber lining, gas inlet manifold faceplate, and various other reactor hardware can be made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

A lift mechanism and motor 32 (FIG. 5A) can raise and/or lower the heater pedestal assembly 12 and its wafer lift pins 12b as wafers are transferred into and out of the body of the chamber 15 by a robot blade (not shown) through an insertion/removal opening 26 in the side of the chamber 10. The motor 32 can raise and/or lower pedestal 12 between a processing position 14 and a lower, wafer-loading position. The motor, valves or flow controllers connected to the supply lines, gas delivery system, throttle valve, RF power supply, and chamber and substrate heating systems can be controlled by a system controller over control lines, of which only some are shown. Controller can rely on feedback from optical sensors to determine the position of movable mechanical assemblies such as the throttle valve and susceptor which are moved by appropriate motors under the control of controller.

In the exemplary embodiment, the system controller can include a hard disk drive (memory), a floppy disk drive and a processor. The processor may contain a single-board computer (SBC), analog and digital input/output boards, interface boards and stepper motor controller boards. Various parts of CVD system 10 can conform to the Versa Modular European (VME) standard which defines board, card cage, and connector dimensions and types. The VME standard can define the bus structure as having a 16-bit data bus and a 24-bit address bus.

System controller can control the activities of the CVD machine. The system controller executes system can control software, which is a computer program stored in a computer-readable medium such as a memory. In some embodiments, the memory can be a hard disk drive or other kinds of memory. The computer program can include sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller.

A process for depositing a film on a substrate or a process for cleaning the chamber 15 can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Figure 5B:
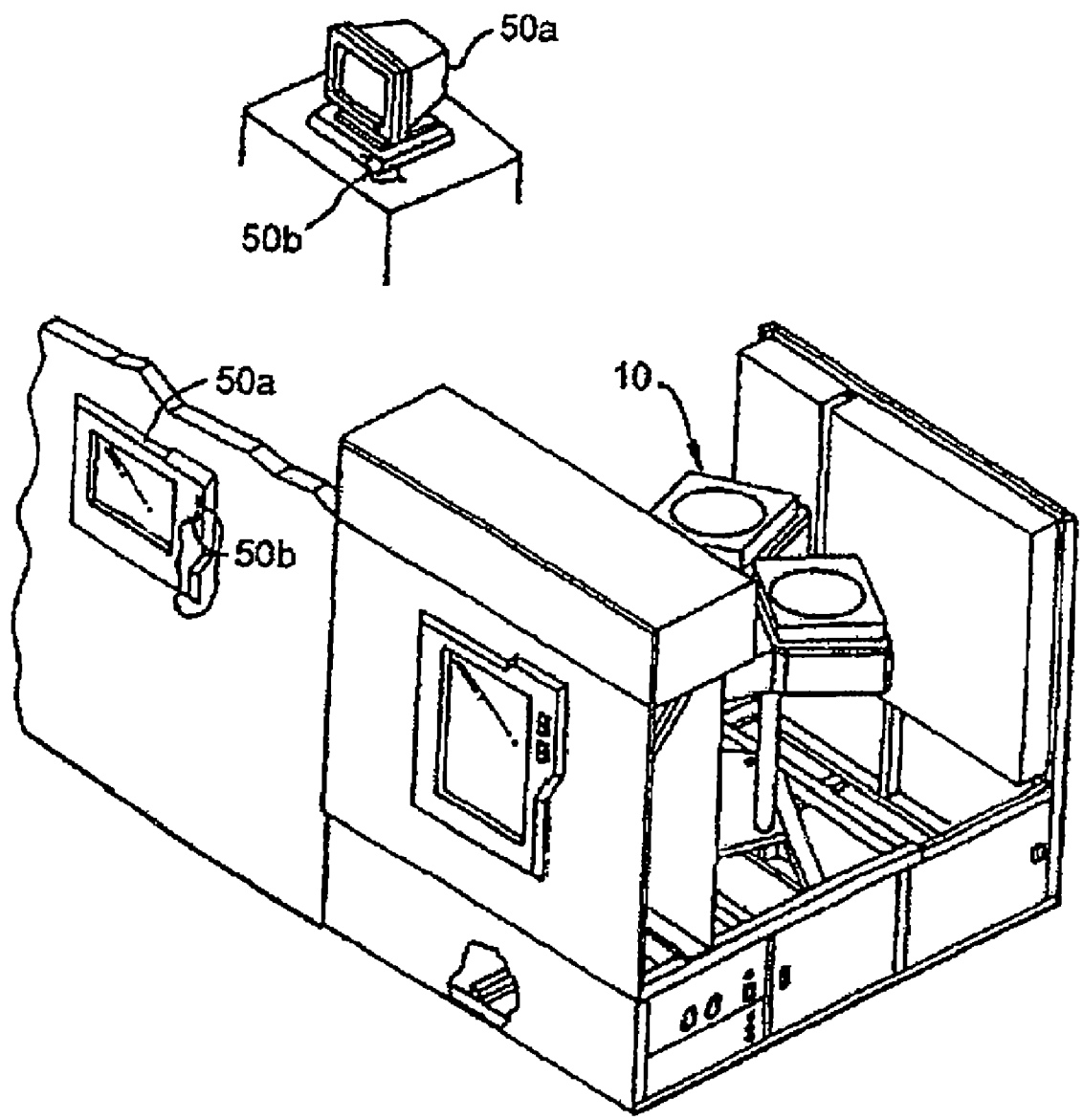
FIG. 5B is a simplified diagram of an exemplary system monitor/controller component of a thin film deposition system.

The interface between a user and the controller 34 can be via a CRT monitor 50a and light pen 50b, shown in FIG. 5B, which can be a simplified diagram of the system monitor and CVD system 10 in a substrate processing system, which may include one or more chambers. In some embodiments, two monitors 50a can be used, one mounted in the clean room wall for the operators and the other behind the wall for the service technicians. The monitors 50a can simultaneously display the same information. In some embodiments, only one light pen 50b may be enabled. A light sensor in the tip of light pen 50b can detect light emitted by CRT display. To select a particular screen or function, the operator can touch a designated area of the display screen and pushes the button on the pen 50b. The touched area can change its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

FIG. 5A shows a remote plasma generator 60 mounted on the lid assembly 15b of the process chamber 15 including the gas distribution faceplate 13a and the gas distribution manifold 11. A mounting adaptor 64 can mount the remote plasma generator 60 on the lid assembly 15b, as best seen in FIG. 5A. The adaptor 64 can be made of metal. The adaptor 64 may include a hole 95, which is coupled to a ceramic isolator 66. A mixing device 70 may be coupled to the upstream side of the gas distribution manifold 11 (FIG. 5A). The mixing device 70 can include a mixing insert 72 disposed inside a slot of a mixing block for mixing process gases. The ceramic isolator 66 can be placed between the mounting adaptor 64 and the mixing device 70 (FIG. 5A). The ceramic isolator 66 may be made of a ceramic material such as $Al_2O_3$ (99% purity), Teflon®, or the like. When installed, the mixing device 70 and ceramic isolator 66 may form part of the lid assembly 15b. The isolator 66 can isolate the metal adaptor 64 from the mixing device 70 and gas distribution manifold 11 to minimize the potential for a secondary plasma to form in the lid assembly 15b as discussed in more detail below. A three-way valve can control the flow of the process gases to the process chamber 15 either directly or through the remote plasma generator 60.

The remote plasma generator 60 can be desirably a compact, self-contained unit that can be conveniently mounted on the lid assembly 15b and be easily retrofitted onto existing chambers without costly and time-consuming modifications. One suitable unit can be the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in the process chamber 15.

Exemplary Etch System

Etch systems that may implement an etch process may include, for example, a SiConi™ Preclean chamber/system, available from Applied Materials, Inc. of Santa Clara, Calif.

Figure 6:
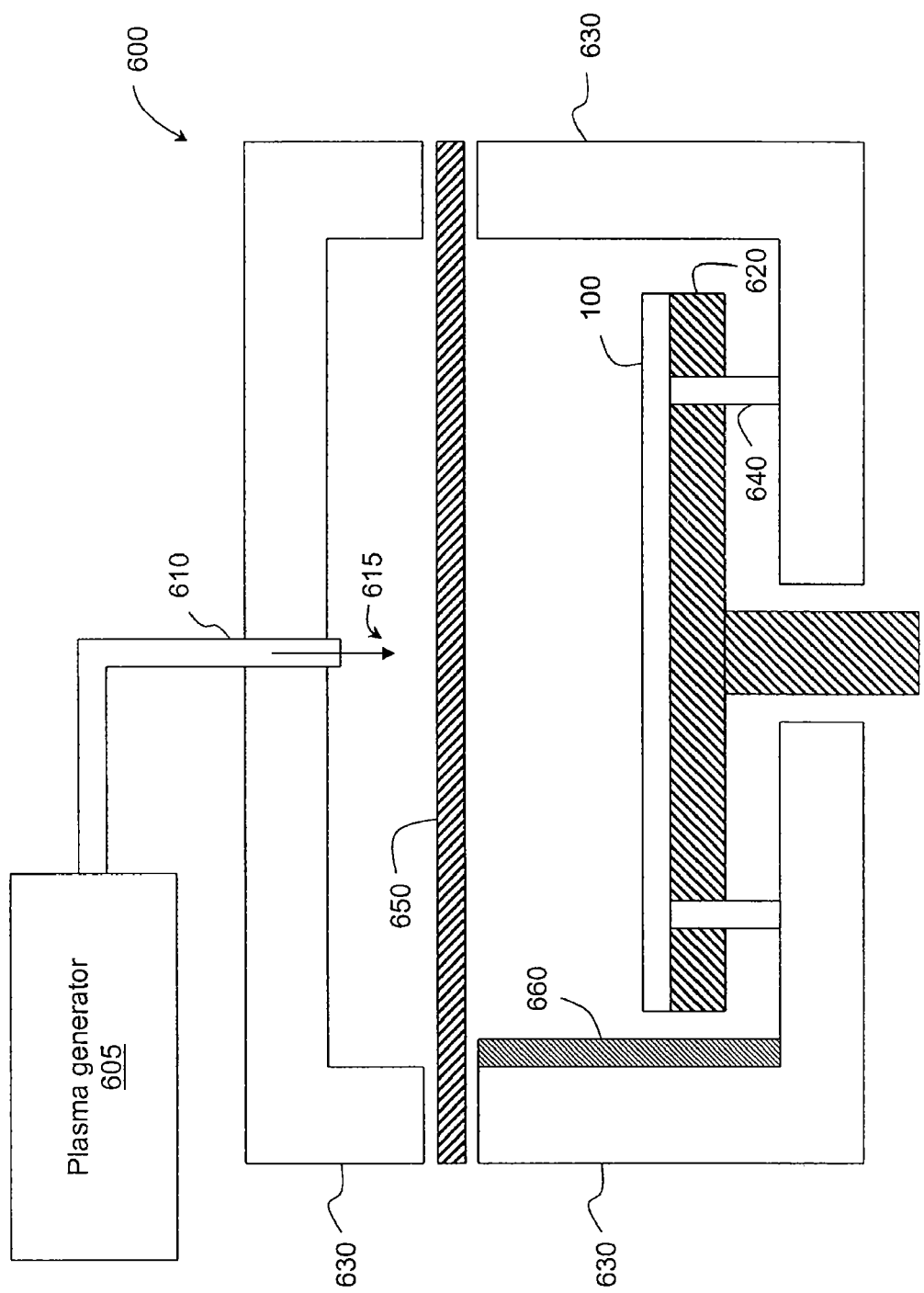
FIG. 6 is a schematic cross-sectional view of an exemplary etch system.

FIG. 6 is a schematic cross-sectional view of an exemplary etch chamber. The etch chamber 600 may include a chamber wall 630. The etch chamber 600 may include a plasma distribution apparatus 610 such as a tube, pipe and/or manifold for dispersing a process plasma 615 to the substrate 100 that rests on a pedestal 620 centered within the process chamber. The etch chamber 600 may be coupled to a plasma generator 605 through the plasma distribution apparatus 610. The plasma generator 605 is configured to generate the plasma 615. The substrate 100 may be moved controllably between a lower position/upper position near to a showerhead 650 by pins 640. The substrate 100 may have the trenches 115 and the dielectric layer 120 (shown in FIG. 1B) formed thereover.

In some embodiments, the plasma distribution apparatus 610 may introduce the plasmas 615 generated by, for example, steps 230, 330, 430, 314, and 442 described above in connection with FIGS. 2-4, into the processing chamber 600. In some embodiments, the supply line for the etch plasmas 615 may include (i) several safety shut-off valves (not shown) that can be used to automatically or manually shut-off the flow of process plasmas into the chamber, and (ii) mass flow controllers (not shown) that measure the flow of the plasmas 615 through the supply line.

Referring again to FIG. 6, the chamber wall 630 may have a temperature to substantially prevent condensations of etchants and/or byproducts thereon. In some embodiments, the pedestal 620 may be operative to provide a desired temperature between about −100° C. and about 1,000° C. (e.g., about −50° C. to about 200° C.) to condense etchants on the surface of the substrate 100, i.e., the dielectric layer 120 over the substrate 100. The etchants then may desirably interact with the dielectric layer 120 formed over the substrate 100 so as to generate the solid product described above in conjunction with FIG. 2-4. After the generation of the byproduct, pins 640 may lift the substrate 100 approaching the showerhead 650. The showerhead 650 may be operative to provide a process temperature between about −50° C. and about 1,000° C. In some embodiments, the showerhead 650 may perform steps 240, 340, 440, 316, and 444 described above in conjunction with FIGS. 2-4 to decompose and/or sublimate the solid product to remove the portions of the dielectric layer 120 and liner.

Referring again to FIG. 6, at least one pumping channel 660 may be configured within the etch chamber 600 to desirably remove the byproducts and/or the decomposed gases. The pumping channel 660 may be coupled to, for example, a pump or motor, such that the byproducts may be desirably removed. In some embodiments, the pumping channel 660 may have at least one aperture (not shown) through which the byproducts can be desirably removed.

In some embodiments, an RF power supply (not shown) may be coupled to the plasma generator 605 to excite a process gas including a fluorine-containing precursor and a hydrogen-containing precursor to form the plasma 615. The RF power supply may be operative to provide a RF power between about 5 watts and about 3,000 watts. The RF power supply may supply the power at a RF frequency between about 100 kHz and about 64 MHz.

system controller (not shown) may controls all of the activities of the etch system. The system controller executes system control software, which is a computer program stored in a computer-readable medium such as a memory. In some embodiments, the memory is a hard disk drive, but the memory may also be other kinds of memory. The computer program includes sets of instructions that dictate the timing, mixture of gases, chamber pressure, chamber temperature and other parameters of a particular process. Other computer programs stored on other memory devices including, for example, a floppy disk or other another appropriate drive, may also be used to operate controller.

A process for etching portions of a film over a substrate can be implemented using a computer program product that is executed by the controller described above. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method for forming a semiconductor structure, comprising:
   forming a plurality of features across a surface of a substrate, at least one space being between two adjacent features;
   forming a first dielectric layer on the features and within the at least one space, wherein the first dielectric layer forms a narrower gap above the opening of the at least one space than a lateral gap deeper within the at least one space;
   interacting a portion of the first dielectric layer with a reactant, the reactant derived from a first precursor and a second precursor, to form a first solid product, wherein the solid product comprises material from both the reactant and the first dielectric layer;
   decomposing the first solid product to substantially remove the portion of the first dielectric layer; and
   forming a second dielectric layer to substantially fill the at least one space.

2. The method of claim 1, wherein forming a plurality of features comprises forming at least a plurality of trenches, conductive lines, openings and transistor gates.

3. The method of claim 1, wherein forming the first dielectric layer comprises forming a silicon oxide layer.

4. The method of claim 1, wherein interacting the portion of the first dielectric layer with a reactant comprises:
   ionizing the first precursor and the second precursor; and
   interacting the ionized first precursor and the ionized second precursor with the portion of the first dielectric layer.

5. The method of claim 1, wherein the first precursor is ammonia ($NH_3$) and the second precursor is nitrogen trifluoride ($NF_3$).

6. The method of claim 1, wherein interacting the portion of the first dielectric layer with the reactant comprises:
interacting the portion of the first dielectric layer with the first precursor and the second precursor.

7. The method of claim 1, wherein the first precursor is ammonia ($NH_3$) and the second precursor is hydrogen fluoride (HF).

8. The method of claim 1, wherein forming the first dielectric layer comprises forming a silicon nitride layer.

9. The method of claim 8, wherein interacting the portion of the first dielectric layer with a reactant comprises:
ionizing the first precursor and the second precursor; and
interacting the portion of the silicon nitride layer with the ionized first precursor and the ionized second precursor.

10. The method of claim 9, wherein the first precursor is hydrogen ($H_2$) and the second precursor is nitrogen trifluoride ($NF_3$).

11. The method of claim 1, wherein decomposing the first solid product comprises thermally treating the first solid product to substantially sublimate the first solid product.

12. The method of claim 1, wherein decomposing the first solid product comprises dissolving the product in a liquid solution.

13. The method of claim 12, wherein the liquid solution comprises water or a polar solvent.

14. The method of claim 1 further comprising forming a liner under the first dielectric layer, wherein an etch selectivity of the first dielectric layer to the liner is about 5:1 or more.

15. The method of claim 14 further comprising:
interacting a portion of the liner with a reactant derived from a third precursor and a fourth precursor to generate a second solid product; and
decomposing the second solid product to remove the portion of the liner.

16. The method of claim 1 further comprising:
interacting another portion of the first dielectric layer with a reactant derived from a third precursor and a fourth precursor to generate a second solid product; and
decomposing the second solid product to remove the another portion of the first dielectric layer.

17. The method of claim 1, wherein forming the first dielectric layer on the features and within the at least one space has a process pressure of about 600 Torr or more.

18. The method of claim 1, wherein decomposing the first solid product forms an angle between slanted sidewalls of the removed first dielectric layer and a bottom of the removed first dielectric layer about 87° or less.

19. A method of depositing a dielectric material in a semiconductor structure having a bottom and sidewalls, the method comprising:
forming a first dielectric layer on the bottom and sidewalls of the structure, wherein the layer partially fills the structure and forms a narrower gap above the opening of the structure than a lateral gap deeper within the structure;
interacting a portion of the first dielectric layer with a reactant derived from a first precursor and a second precursor to form a first solid product, wherein the solid product comprises material from both the reactant and the first dielectric layer;
thermally treating the first solid product to substantially sublimate the first solid product and form a slanted opening in the structure; and
forming a second dielectric layer to substantially fill the spaces.

20. The method of claim 19, wherein the structure is a gap, and a first angle formed between the bottom and one of the sidewalls of the gap ranges from about 89° to about 91°, and wherein a second angle between a sidewall and bottom of the slanted opening is less than 87°.

21. The method of claim 20, wherein interacting the portion of the first dielectric layer with a reactant comprises:
forming a plasma from the first precursor and the second precursor; and
interacting the plasma with the portion of the first dielectric layer.

22. The method of claim 21, wherein the first precursor is ammonia ($NH_3$) and the second precursor is nitrogen trifluoride ($NF_3$) or hydrogen fluoride (HF).

23. The method of claim 21, wherein interacting the portion of the first dielectric layer with a reactant comprises:
introducing the first precursor and the second precursor into an etch chamber; and
interacting the portion of the first dielectric layer with the first precursor and the second precursor.

24. The method of claim 19, wherein forming the first dielectric layer comprises forming a silicon nitride layer.

25. The method of claim 24, wherein interacting the portion of the first dielectric layer with a reactant comprises:
ionizing the second precursor;
introducing the first precursor and the ionized second precursor into an etch chamber; and
interacting the portion of the silicon nitride layer with the first precursor and the ionized second precursor.

* * * * *